United States Patent
Narkis et al.

(10) Patent No.: US 7,645,933 B2
(45) Date of Patent: Jan. 12, 2010

(54) CARBON NANOTUBE SCHOTTKY BARRIER PHOTOVOLTAIC CELL

(75) Inventors: Todd R. Narkis, Indianapolis, IN (US);
Matt S. Marcus, Madison, WI (US);
Max G. Lagally, Madison, WI (US);
Mark A. Eriksson, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 633 days.

(21) Appl. No.: 11/070,834

(22) Filed: Mar. 2, 2005

(65) Prior Publication Data

US 2006/0196537 A1    Sep. 7, 2006

(51) Int. Cl.
*H01L 31/00* (2006.01)
*H02N 6/00* (2006.01)
*H01J 9/02* (2006.01)
*H01J 1/00* (2006.01)

(52) U.S. Cl. .................. 136/252; 136/243; 313/310; 313/311

(58) Field of Classification Search .......... 136/243–265
See application file for complete search history.

(56) References Cited

U.S. PATENT DOCUMENTS

| | | | |
|---|---|---|---|
| 4,053,918 A | 10/1977 | Fletcher et al. | |
| 4,163,677 A | 8/1979 | Carlson et al. | |
| 4,227,943 A | 10/1980 | Cohen et al. | |
| 4,260,427 A | 4/1981 | Fulop et al. | |
| 4,345,107 A | 8/1982 | Fulop et al. | |
| 4,388,483 A | 6/1983 | Basol et al. | |
| 5,084,365 A | 1/1992 | Gratzel et al. | |
| 6,400,088 B1 | 6/2002 | Livingston et al. | |
| 6,538,262 B1 | 3/2003 | Crespi et al. | |
| 6,580,027 B2 | 6/2003 | Forrest et al. | |
| 6,628,053 B1 | 9/2003 | Den et al. | |

(Continued)

FOREIGN PATENT DOCUMENTS

WO    WO 00/26138    5/2000

(Continued)

OTHER PUBLICATIONS

Mukul Kumar, Yoshinori Ando, A simple method of producing aligned carbon nanotubes from an unconvention precursor—Camphor, 2003, Chemical Physics Letters, 374, 521-526.*

(Continued)

*Primary Examiner*—Jennifer K Michener
*Assistant Examiner*—Shannon Gardner
(74) *Attorney, Agent, or Firm*—Boyle Fredrickson, S.C.

(57) ABSTRACT

Carbon nanotube Schottky barrier photovoltaic cells and methods and apparatus for making the cells are provided. The photovoltaic cells include at least one contact made from a first contact material, at least one contact made from a second contact material and a plurality of photoconducting carbon nanotubes bridging the contacts. A Schottky barrier is formed at the interface between the first contact material and the carbon nanotubes while at the interface between the second contact material and the carbon nanotubes, a Schottky barrier for the opposite carrier is formed, or a small, or no Schottky barrier is formed. It is the Schottky barrier asymmetry that allows the photo-excited electron-hole pairs to escape from the carbon nanotube device.

16 Claims, 7 Drawing Sheets

U.S. PATENT DOCUMENTS

| | | | |
|---|---|---|---|
| 6,630,772 | B1 | 10/2003 | Bower et al. |
| 6,683,783 | B1 | 1/2004 | Smalley et al. |
| 2002/0127162 | A1 | 9/2002 | Smalley et al. |
| 2002/0127169 | A1 | 9/2002 | Smalley et al. |
| 2002/0159943 | A1 | 10/2002 | Smalley et al. |
| 2002/0176650 | A1 | 11/2002 | Zhao et al. |
| 2002/0192441 | A1 | 12/2002 | Kalkan et al. |
| 2003/0111104 | A1 | 6/2003 | Akamatsu |
| 2003/0185741 | A1 | 10/2003 | Matyjaszewski et al. |
| 2003/0189235 | A1 | 10/2003 | Watanabe et al. |
| 2003/0207573 | A1 | 11/2003 | Ramm et al. |
| 2003/0217928 | A1 | 11/2003 | Lin et al. |
| 2004/0241900 | A1 | 12/2004 | Tsukamoto et al. |
| 2006/0055392 | A1 * | 3/2006 | Passmore et al. ........... 324/71.1 |

FOREIGN PATENT DOCUMENTS

WO     WO 2005050757 A2 * 6/2005

OTHER PUBLICATIONS

Leonard, et al., "Role of Fermi-Level Pinning in Nanotube Schottky Diodes," Phys. Rev. Lett., vol. 84, 2000, pp. 4693-4696.

Odintsov, "Schottky Barriers in Carbon Nanotube Heterojunctions," Physical Review Letters, vol. 85, No. 1, Jul. 3, 2000, pp. 150-153.

Lin, et al., "Hole Schottky Barrier Height Enhancement and its Application to Metal-Semiconductor-Metal Photodetectors," Journal of Applied Physics, vol. 90, No. 11, Dec. 1, 2001, pp. 5666-5669.

Aslett, "Carbon Nanotubes to Improve Solar Cells," EE Times, Jan. 16, 2002.

Jenkins, et al., "CdTe Back Contact: Response to Copper Addition and Out-Diffusion," NCPV and Solar Program Review Meeting 2003, www.nrel.gov/ncpv_prm/pdfs/33586866.pdf.

Kymakis, et al., "High Open-Circuit Voltage Photovoltaic Devices from Carbon-Nanotube-Polymer Composites," Journal of Applied Physics, vol. 93, No. 3, Feb. 1, 2003, pp. 1764-1768.

Misewich, et al., "Electrically Induced Optical Emission from a Carbon Nanotube FET," Science, vol. 300, May 2, 2003, pp. 783-786.

"Carbon Nanotubes Light Up," physicsweb.com, May 2, 2003.

"Pioneering New Applications for Carbon Nanotubes," globalcomposites.com, Jul. 5, 2003.

Levitsky, et al., Photoconductivity of Single-Wall Carbon Nanotubes Under Continuous-Wave Near-Infrared Illumination,' Applied Physics Letters, vol. 83, No. 9, Sep. 1, 2003, pp. 1857-1859.

"Carbon Nanotubes for Solar Cells," scientificamerican.com, Sep. 15, 2003.

Xue, et al., "Schottky Barriers at Metal-Finite Semiconducting Carbon Nanotube Interfaces," Applied Physics Letters, vol. 83, No. 12, Sep. 22, 2003, pp. 2429-2431.

Yamada, "Modeling of Carbon Nanotube Schottky Barrier Modulation Under Oxidizing Conditions," Physical Review B, vol. 69, 2004, pp. 125408-1-125408-8.

Levitsky, "Photovoltaic Cells Based on Nanotubes and Conjugated Polymers," www.winbmdo.com, printed Mar. 2, 2004.

"Gratzel Cells-Solar Cells Based on Titanium Dioxide," azom.com, printed Mar. 2, 2004.

Levitsky, et al., "Photoconductivity of Single-Walled Carbon Nanotubes Under CW Illumination," published on the web prior to Mar. 2005.

Varadan, et al., "Nano- and Micro- Devices for Performance Improvement of SSP System," published on the web prior to Mar. 2, 2005 at www.kurasc.kyoto-u.ac.ip/jusps/52-2.pdf.

International Search Report for PCT/US2006/006074 dated Sep. 25, 2007.

Hirose, et al., "Chemistry and Electronic Properties of Metal-Organic Semiconductor Interfaces: Al, Ti, In, Sn, Ag, and Au on PTCDA," Physical Review B, vol. 54, No. 19, Nov. 15, 1996, pp. 13 748-13 758.

Krinke, et al., "Nanostructured Deposition of Nanoparticles from the Gas Phase," Particle & Particle Systems Characterization, vol. 19, Issue 5, Nov. 4, 2002, pp. 321-326 (Abstract).

Kymakis, et al., "Carbon Nanotubes as Electron Acceptors in Polymeric Photovoltaics," Rev. Adv. Mater. Sci. 10 (2005) 300-305.

Shan, et al., "First Principles Study of Work Functions of Single Wall Carbon Nanotubes," Stanford University Dissertation, Apr. 7, 2005.

* cited by examiner

CARBON NANOTUBE SCHOTTKY BARRIER PHOTOVOLTAIC CELL

STATEMENT OF GOVERNMENT RIGHTS

This invention was made with United States government support awarded by the following agency: NSF 0079983. the United States government has certain rights in this invention.

BACKGROUND OF THE INVENTION

Photovoltaic cells convert sunlight directly into electricity by the interaction of photons and electrons within a photoconducting material. To create a photovoltaic cell a photoconducting material, commonly silicon, is joined by electrical contacts to form a junction. Presently, most silicon-based photovoltaic cells are silicon p-n junction devices. Photons striking the cell cause the mismatched electrons to be dislodged creating a current as they move across the junction. A grid of these electrical contacts creates an array of cells from which the current is gathered. The DC current produced in the cell depends on the materials involved and the energy and intensity of the radiation incident on the cell.

Photovoltaic cells have been available for a number of years and it has been predicted that the use of photovoltaics will continue to increase for years to come. The major obstacles to photovoltaic use throughout the world are cell efficiency and cell cost. Presently, the cost per watt for most photovoltaic cells is not low enough for these cells to be competitive with other energy sources. Currently, single crystal silicon is the photovoltaic material of choice. Amorphous silicon is also used because it is less expensive; unfortunately it is also less efficient than single crystal silicon. Gallium arsenide cells are among the most efficient cells presently available, but they are quite expensive. Thus, a need exists for a photovoltaic cell that is both cost and energy efficient.

SUMMARY OF THE INVENTION

The present invention encompasses carbon nanotube Schottky barrier photovoltaic cells and methods and apparatus for making the cells. In these photovoltaic cells, carbon nanotubes serve as a photovoltaic material bridging one or more first contacts with which the carbon nanotubes form a Schottky barrier (either for electrons or for holes) and one or more second contacts with which the carbon nanotubes either form smaller Schottky barriers for the same carrier, do not form a Schottky barrier at all, or form a Schottky barrier for the opposite carrier. These photovoltaic cells are efficient and relatively inexpensive to manufacture. Because the band gaps of different carbon nanotubes span a large energy range, depending on the tube diameter and chirality, a cell containing a mixture of nanotubes having a variety of diameters and/or chiralities can absorb efficiently across a broad spectrum.

One aspect of the invention provides a photovoltaic cell including a first contact or a first set of contacts made from a first electrically conducting material, a second contact or a second set of contacts made from a second electrically conducting material and a plurality of carbon nanotubes bridging the first and second contacts (or sets of contacts). In one embodiment, the first electrically conductive material, typically a metal, has a lower work function than the carbon nanotubes. As a result, the junctions formed between the first electrically conducting material and the nanotubes are characterized in that they form Schottky barriers for electrons. The second electrically conductive material desirably has a work function close to that of the carbon nanotubes, such that no Schottky barrier is formed at the junction.

In another embodiment, Schottky barriers for electrons are formed at the junctions between the first electrically conductive material and the carbon nanotubes. However, in this second embodiment the junctions formed between the second electrically conducting material and the nanotubes are characterized in that they form Schottky barriers for electrons that are smaller than those formed at the junctions between the first electrically conducting material and the carbon nanotubes.

In yet another embodiment, Schottky barriers for electrons are formed at the junctions between the first electrically conductive material and the carbon nanotubes and Schottky barriers for holes are formed at the junctions between the second electrically conducting material and the nanotubes. In this embodiment, the second electrically conductive material is selected such that it has a higher work function that the carbon nanotubes.

A second aspect of the invention provides a microphotodetector including a first contact made from a first electrically conducting material, a second contact made from a second electrically conducting material and at least one carbon nanotube bridging the first and second contacts. A current detector is connected to the first and second contacts to detect any photocurrent generated by radiation incident on the at least one carbon nanotube. As in the photovoltaic cell, the first electrically conductive material, typically a metal, has a lower work function than the carbon nanotubes and the second electrically conductive material may have a work function lower than that of the nanotubes but higher than that of the first electrically conductive material, close to that of the carbon nanotubes, or higher than that of the carbon nanotubes. As a result, the junctions formed between the first electrically conducting material and the nanotubes are characterized in that they form Schottky barriers for electrons. The junctions formed between the second electrically conducting material and the nanotubes are characterized in that they form a Schottky barrier for electrons that is lower than the Schottky barriers at the junctions between the first electrically conductive material, do not form Schottky barriers for electrons or holes, or form Schottky barriers for holes.

The first and second electrically conductive materials may be any materials having appropriate work functions. Suitable conductive materials include, but are not limited to metals, conducting polymers and conducting oxides. Titanium is a non-limiting example of a first electrically conductive material and gold is a non-limiting example of a second electrically conductive material that may be employed in the devices provided herein.

A third aspect of the invention provides methods for producing photovoltaic cells from carbon nanotubes. These methods include the steps of exposing an electrostatically charged polymer film to a gaseous stream containing carbon nanotubes such that the nanotubes come into contact with and become affixed to the polymer film via electrostatic interactions to provide a random arrangement of the carbon nanotubes supported on the polymer film. A contact (or set of contacts) made from a first electrically conducting material is deposited on the polymer film (e.g., either under or over the supported nanotubes) such that one end of at least some of the nanotubes is in contact with the first electrically conductive material. A second contact (or set of contacts) is then deposited on the polymer film such that the opposing ends of at least some of the nanotubes are in contact with the second electrically conductive material. Those nanotubes having a contact of the first electrically conductive material at one end and a contact of the second electrically conductive material at the opposing end may participate in photoconduction.

A fourth aspect of the invention provides an apparatus for producing photovoltaic cells from carbon nanotubes. The apparatus includes a reactor adapted to produce a gaseous stream containing carbon nanotubes and an electrostatically charged polymer film disposed in the path of the gaseous stream such that when the gaseous stream exits the reactor it passes over the polymer film and the nanotubes suspended in the stream become attached to the polymer film through electrostatic interactions.

A fifth aspect of the invention provides systems powered by the photovoltaic cells provided herein. These systems include an electrical power consuming device, such as a power grid, electrically connected to and powered by one or more of the photovoltaic cells.

Further objects, features and advantages of the invention will be apparent from the following detailed description when taken in conjunction with the accompanying drawings.

DETAILED DESCRIPTION OF THE PREFERRED EMBODIMENTS

Figure 1:
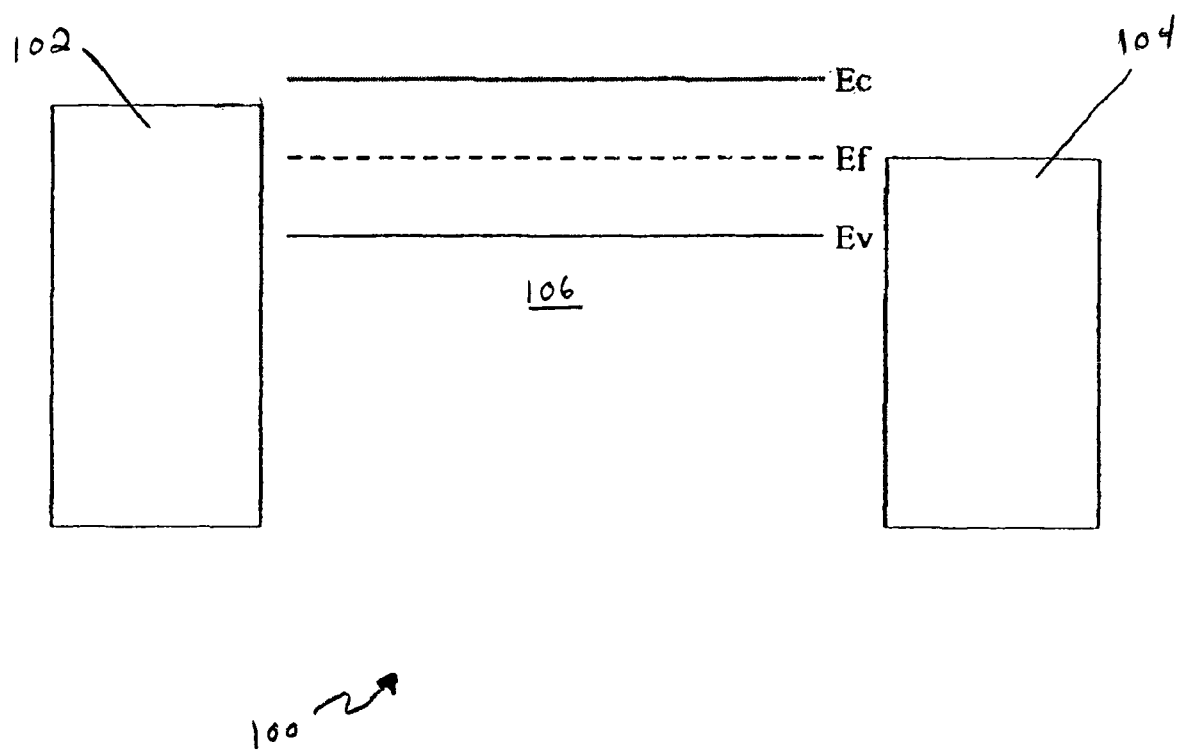
FIG. 1 is a diagram of the energy levels for a titanium contact, a carbon nanotube and a gold contact before contact is made.

Carbon nanotube Schottky barrier photovoltaic cells, photodetectors, methods and apparatus for making the photovoltaic cells, and systems powered by the photovoltaic cells are provided in accordance with the present invention.

In the photovoltaic cells, a plurality of photoconducting carbon nanotubes are attached at one end to one or more first contacts with which the carbon nanotubes form a Schottky barrier or electrons or holes and at the opposing end to one or more second contacts with which the carbon nanotubes either form: 1) a smaller Schottky barrier; 2) no Schottky barrier; or 3) a Schottky barrier for the opposite carriers (i.e., holes or electrons). In these cells, the Schottky barrier (or barriers) provides a built-in electric field that can separate photogenerated electron-hole pairs. Because the opposing ends of each nanotube do not have identical Schottky barriers, the electron-hole pairs are free to escape the nanotube and recombine, generating a photocurrent that can flow through an external circuit connected to the first and second contacts.

In the photodetectors, at least one carbon nanotube is attached at one end to a first contact with which the carbon nanotube forms a Schottky barrier for electrons or holes and at the opposing end to a second contact with which the carbon nanotube either forms a smaller Schottky barrier for the same carriers, does not form a Schottky barrier for electrons or holes or forms a Schottky barrier for the opposite carriers. A current detector is connected to the first and second contacts in order to detect any photocurrent generated in the at least one carbon nanotube.

Carbon nanotubes are carbon molecules with diameters on the nanometer scale and lengths on the micrometer scale. These nanotubes have unique electrical, physical and mechanical properties inherent to their tubular structure. One particularly interesting property of carbon nanotubes is that they can be semiconducting or metallic depending on the molecular structure of the tube. Additionally, the nanotube's band structure is dependent on the diameter of the nanotube, making it possible to tailor a nanotube's electrical properties by choosing the appropriate diameter for use in a device, such as a photovoltaic cell or a photodetector. For example, a nanotube having a particular diameter may be selected in order to provide a photodetector for detecting radiation of a specific energy.

Carbon nanotubes are significantly more flexible than other crystalline photovoltaics. This flexibility allows the nanotubes to be placed on a polymer support which vastly reduces production costs. The need for silicon processing environments including hazardous chemicals, wasteful efficiencies, and expensive air handling equipment may thereby be avoided.

The carbon nanotube Schottky barrier photovoltaic cells provided herein generally operate in the same manner as typical photovoltaic cells, where a photon excites an electron from the valence band into the conduction band. If the electron-hole pair generated by this action feels a voltage, the electron and hole will be separated. In the carbon nanotube Schottky barrier photovoltaic cells, an electric field is set up by the difference in work functions between the nanotube and a contact at one end of the nanotube. The use of carbon nanotubes in the cells makes it possible to provide photovoltaic cells with improved efficiencies compared to more conventional photovoltaic cells. This is because a large number of carbon nanotubes having different diameters, which absorb different energies may be employed in a single cell. As a result, the cells are able to absorb energy across a broad radiation spectrum, enhancing their overall efficiency.

In the devices provided herein, contacts made from two different conductive materials are used. A first material, having a work function that is either lower or higher than the work function of the carbon nanotubes, is disposed on one end of the nanotubes, and a second material is disposed on the other end. When the first material has a work function lower than that of the carbon nanotubes a Schottky barrier for electrons forms at the nanotube junction. In this case, the second material may have a work function that is higher than that of the carbon nanotubes, such that a Schottky barrier for holes is formed at the nanotube junction; that lies between the work functions of the first electrically conductive material and the carbon nanotubes; or that is substantially the same as that of the carbon nanotubes, such that no Schottky barriers are formed at the nanotube junction. Similarly, when the first material has a work function higher than that of the carbon nanotubes a Schottky barrier for holes forms at the nanotube junction. In this case, the second material may have a work that lies between the work functions of the first electrically conductive material and the carbon nanotubes; or that is substantially the same as that of the carbon nanotubes, such that no Schottky barriers are formed at the nanotube junction.

Figure 2:
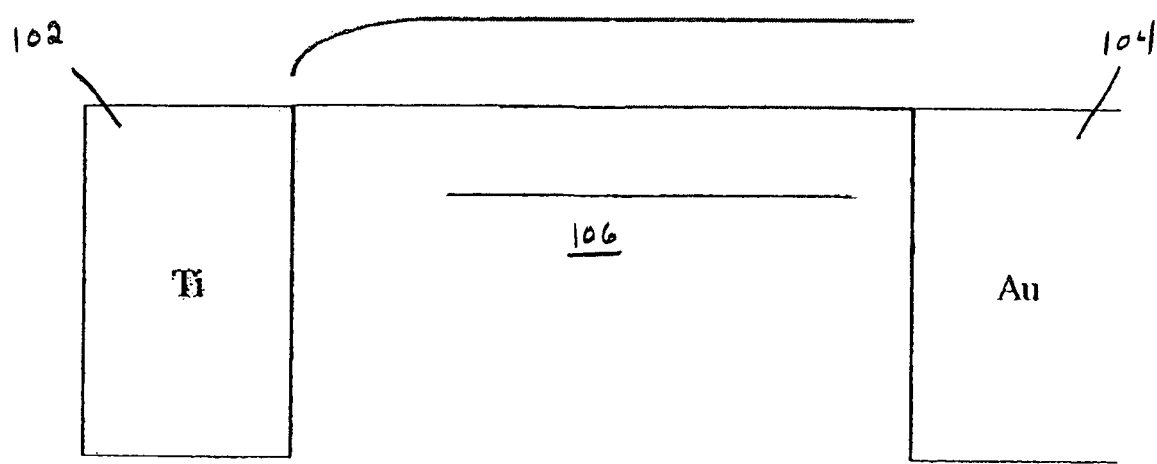
FIG. 2 is a diagram of the energy levels for a titanium contact, a carbon nanotube and a gold contact after contact is made.

FIG. 1 shows the band structure 100 of the components of a carbon nanotube Schottky barrier device made from a titanium contact 102, a gold contact 104 and a carbon nanotube 106. This figure shows the band structure of the device before contact has been made between the components. As shown in the figure, the work functions for the nanotube 106 and the gold contact 104 are aligned fairly well, while the work functions for the nanotube 106 and the titanium contact 102 are not. After the materials are brought into contact, the work function difference between the nanotube 106 and the titanium 102 will cause band bending in the vicinity of the junction. This is shown in FIG. 2. This band bending will set up an electric field that separates electron-hole pairs generated by photons incident on the nanotube. These electron-hole pairs will be the current measured in the devices provided herein.

The first contact material may be a conductive material having a work function that is lower than the work function of the carbon nanotubes such that a Schottky barrier for electrons forms at the contact/nanotube junction. Alternatively, the first contact material may be a conductive material having a work function that is higher than the work function of the carbon nanotubes, such that a Schottky barrier for holes is formed at the contact/nanotube junction. The first contact material may be any electrically conducting material, including metals, conducting polymers and conducting oxides, having an appropriate work function. The first contact material desirably has a work function that is at least 0.3 eV higher or lower than the work function of the carbon nanotubes. This includes first contact materials having a work function that is at least 0.5 eV higher or lower than the work function of the carbon nanotubes and further includes first contact materials having a work function that is at least 0.7 eV higher or lower than the work function of the carbon nanotubes. The work function for single walled carbon nanotubes is about 5 eV. Therefore, one exemplary metal for use as the first contact material is titanium (work function approximately 4.3 eV).

The second contact material may be a conductive material having a work function similar to the work function of the carbon nanotubes such that a Schottky barrier is not formed at the contact/nanotube junction. Alternatively, the second contact material may be a conductive material having a work function sufficient to provide a Schottky barrier at the contact/nanotube junction, where the Schottky barriers at either end of the carbon nanotubes are Schottky carriers for opposite carriers. Like the first contact material, the second contact material may be any electrically conducting material, including metals, conducting polymers and conducting oxides, having an appropriate work function. In some embodiments the second contact material desirably has a work function within about 0.1 eV of the work function of the carbon nanotubes. This includes second contact materials having a work function that differs from the work function of the carbon nanotubes by no more than 0.05 eV. The work function for single walled carbon nanotubes is about 5 eV. Therefore, suitable metals for use as the second contact material include gold (work function approximately 5 eV).

The carbon nanotube Schottky barrier photovoltaic cells provided herein will include a plurality (e.g., on the order of billions or even trillions) of carbon nanotubes bridging two contact materials as described above. For example, a carbon nanotube photovoltaic cell in accordance with the present invention might contain about 10$^9$ nanotubes per square cm. This includes embodiments where the photovoltaic cell contains about 10$^{10}$ nanotubes per square centimeter. Such cells can provide a current density of up to approximately 50 mA/cm$^2$ or even up to approximately 100 mA/cm$^2$. This is significantly higher than other conventional silicon photovoltaic cells which operate at approximately 40 mA/cm$^2$ or less.

Figure 3:
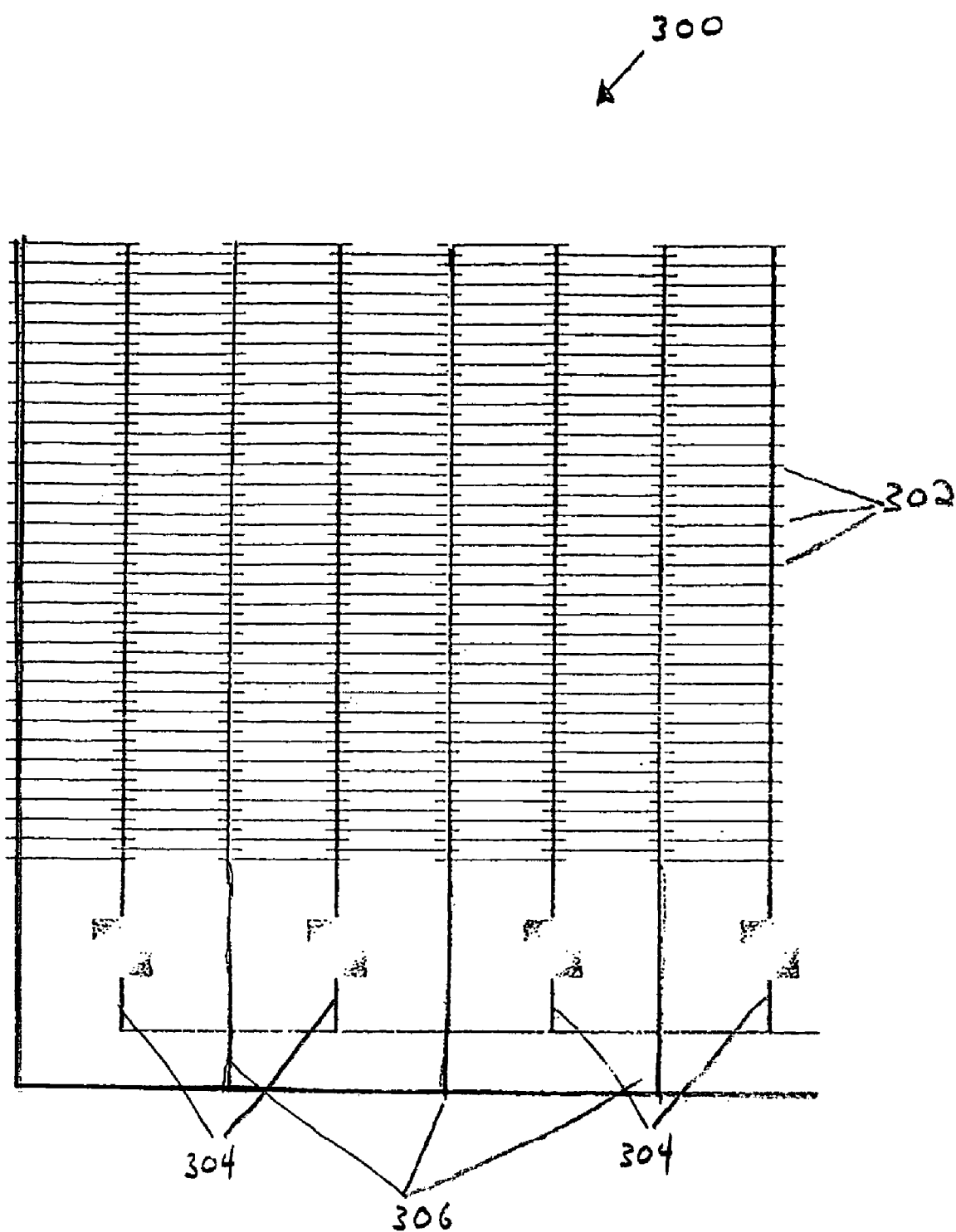
FIG. 3 is a diagram of a carbon nanotube Schottky barrier photovoltaic cell made from a plurality of aligned carbon nanotubes bridging a plurality of titanium contacts and a plurality of gold contacts.

FIG. 3 shows a schematic diagram of a cell 300 made from a plurality of carbon nanotubes 302 disposed between grids of titanium 304 and gold contacts 306. The nanotubes are placed in alignment on a surface of a polymer film with titanium and gold contacts placed in electrical contact with of the nanotubes in an alternating fashion, utilizing each contact for current collection from nanotubes on either side. A broad range of polymer films may be used for this purpose. Examples of suitable polymer films include polyamide films (e.g., nylon films), polyester films (e.g., Mylar films) and polyethylene films. The cells can then be wired to either increase the current or increase the voltage just as in a more conventional photovoltaic cell. The nanotubes do not have to be ordered as shown as long as they reach two different contacts.

The photovoltaic cells may be electrically connected to various electrical power consuming devices in order to power said devices. Electrical power consuming devices that may be powered with the photovoltaic cells include, but are not limited to, computers, mobile phones, calculators and watches. On a larger scale, the electrical power consuming device may be a power grid.

A method and apparatus for producing a carbon nanotube Schottky barrier photovoltaic cell from a plurality of randomly aligned nanotubes are also provided. In this method a negatively electrostatically charged polymer film is exposed to a vapor containing carbon nanotubes. The carbon nanotubes are electrostatically attracted to the charged film and, therefore, become affixed to the film through electrostatic interactions. The result is a layer (or layers) of randomly aligned carbon nanotubes attached to the polymer film. A grid of contacts of a first contact material and a grid of contacts of a second contact material may be patterned onto the film over or under the nanotubes. Those nanotubes that span contacts of the first and second contact materials contribute to the photocurrent in the resulting photovoltaic cell.

Figure 4:
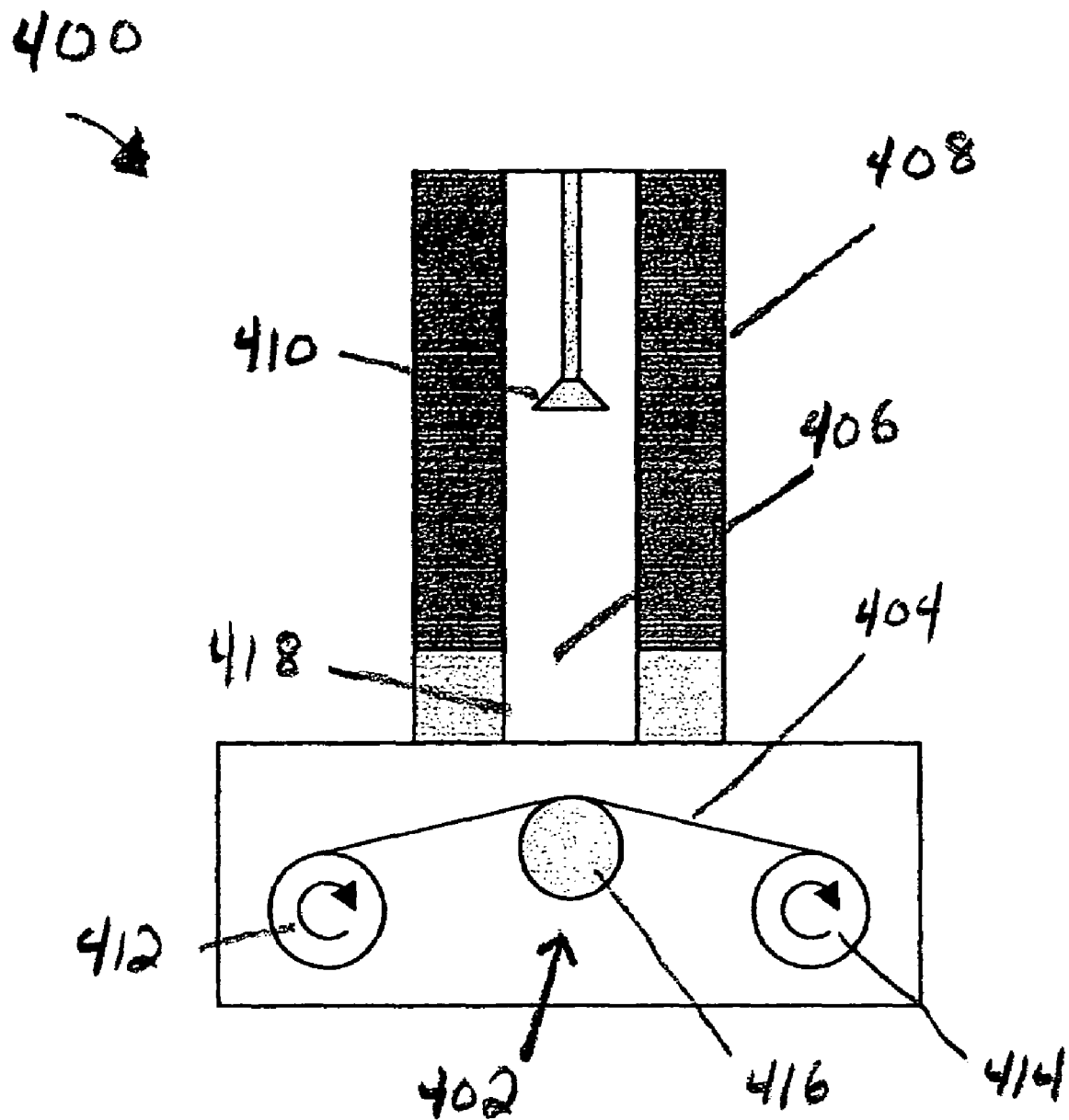
FIG. 4 is a schematic diagram of an apparatus for making a carbon nanotube Schottky barrier photovoltaic cell.

An apparatus for making carbon nanotube Schottky barrier photovoltaic cells in accordance with the method outlined above is shown in FIG. 4. The apparatus 400 includes a mount 402 for a polymer film 404 disposed below an outlet 406 of a reactor 408 adapted to produce a gaseous stream containing nanotubes from a reactant gas and a catalyst. The reactor 408 includes an inlet port 410 adapted to introduce reactant gas and gas-borne catalyst particles into the reactor where carbon nanotubes are formed. In the specific embodiment depicted in FIG. 4, the polymer film mount 402 includes two rollers 412, 414 between which the polymer film 404 is wound. The mount 402 optionally includes a cooling roller 416 to cool the polymer film 404 as it is passed from the first roller 412 to the second roller 414. As shown in the figure, the inlet port 410 may be a cooled showerhead-style input port which injects catalyst particles into the reactor carried by reactive gases. Carbon nanotubes are formed in the reactor 408 and cool as they pass through a cooling zone 418 below the reactor 408. The carbon nanotubes exiting the cooling zone 418 are attracted, via electrostatic charge, to the polymer film 404 between the rollers 412, 414. Once the carbon nanotubes contact the polymer film 404 they become fixed to the surface thereof through electrostatic interactions. Grids of contacts, such as those shown in FIG. 3, may then be deposited over the nanotubes on the polymer film to provide a photovoltaic cell. The contacts or grids of contacts may be deposited using standard photolithographic techniques.

Reactors commonly used in the synthesis of carbon nanotubes (e.g. via high pressure carbon monoxide (HiPCo) processes) are well known and commercially available. One such reactor and a HiPCo process for producing carbon nanotubes in the reactor is described in PCT patent application publication number WO 00/26138, the entire disclosure of which is incorporated herein by reference. Briefly, the reactor may include a reaction vessel having a reactant introduction zone, a reactant mixing zone, a growth and annealing zone and a product recovery zone. The reactant introduction zone is in fluid communication with input ports through which the reactant gas (e.g. CO) and the gaseous catalyst precursor (e.g. $Fe(CO)_5$) are introduced into the vessel. Mixing means may be provided in the vessel to mix the reactant gas and catalyst precursor in the reactant mixing zone and heating means (e.g. a heater, oven or furnace) may be provided to maintain the growth and annealing zone at an elevated temperature. In the process carried out in this apparatus, the reactant gas and catalyst precursor are heated to a temperature sufficient to decompose the catalyst precursor, forming catalyst metal atom clusters and to promote the initiation and growth of single walled carbon nanotubes, resulting in a suspension of single walled carbon nanotubes in a gaseous stream. This gaseous stream may then carry the carbon nanotubes out of the furnace and onto the polymer film.

The polymer films may be electrostatically charged with an electrostatic charger device. Devices and methods for electrostatically charging polymer films are well known. Suitable methods include, but are not limited to corona charging methods, thermal charging methods, photoelectric charging methods, radio charging methods, low-energy electron beam charging methods and contact charging methods. Descriptions of these methods and devices for carrying out electrostatic charging may be found in U.S. Pat. No. 5,012,094, the entire disclosure of which is incorporated herein by reference.

Other suitable methods for producing the carbon nanotubes include, but are not limited to, chemical vapor deposition methods. One such method is described in greater detail below.

In this example, individual single walled carbon nanotubes were grown using chemical vapor deposition (CVD). Titanium and gold contacts were then photolithographically deposited on opposite ends of the nanotubes.

The carbon nanotubes were grown on a silicon wafer according to the following procedure. A silicon (001) wafer was thermally oxidized and diced into chips having dimensions of approximately 2 to 3 millimeters (mm). Drops of a catalyst solution (FirstNano, Inc., Carpinteria, Calif.) were spotted onto each chip using the fluid dispensation device described in U.S. Patent Publication No. 2004/0071601, the entire disclosure of which is incorporated herein by reference. Briefly, this device includes an elongated nozzle with a diced piece of piezoelectric material bonded to the nozzle's outer surface. When the piezoelectric material is actuated at ultrasonic frequencies, fluid in the nozzle is ejected onto an underlying substrate. The silicon chips were then transferred into an EasyTube furnace (FirstNano, Inc., Carpinteria, Calif.) where carbon nanotubes were grown on the chips. Typical growth conditions are a furnace temperature of about 900° C. under 500 sccm $CH_4$ at a pressure of about 750 Torr for about 15 minutes, however the present invention is not limited to nanotubes grown under these conditions.

After the carbon nanotubes were grown on the chips and the chips were removed from the furnace and allowed to cool, titanium contacts were photolithographically deposited onto one side of the carbon nanotubes. The chips were then viewed under a scanning electron microscope and the most promising chips were selected. The selected chips were then aligned and gold contacts were photolithographically deposited on the ends opposite the titanium contacts. An aluminum wire bonding machine was then used to attach leads to the contacts.

Figure 5:
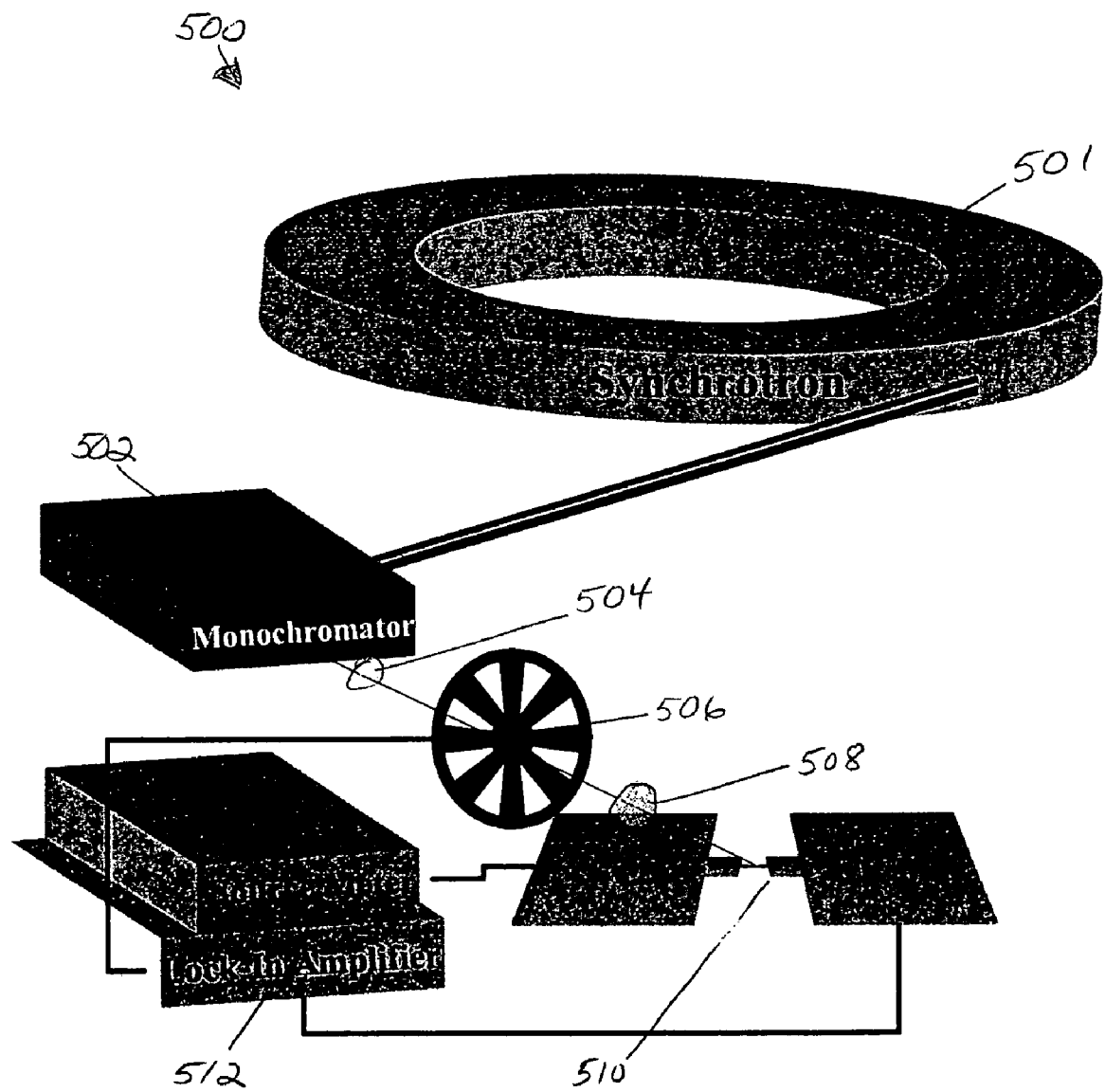
FIG. 5 is a schematic diagram of an apparatus for measuring the photocurrent in a carbon nanotube Schottky barrier photovoltaic cell.
Figure 6:
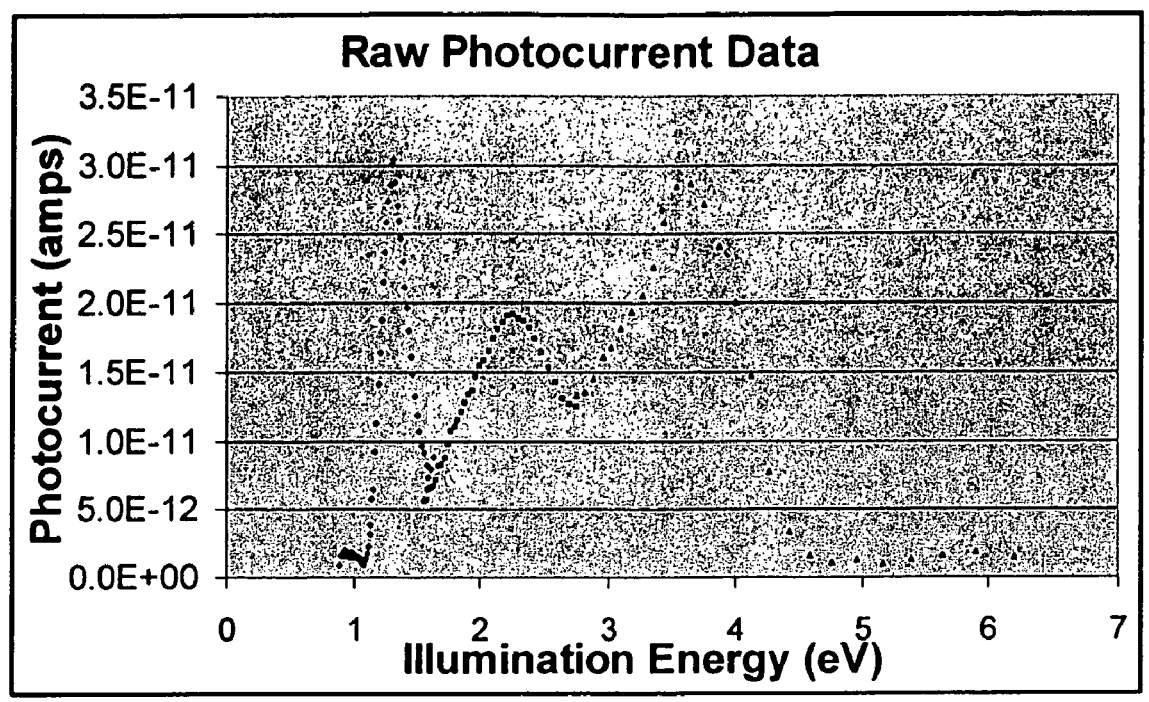
FIG. 6 is a graph of the raw photocurrent of a first photovoltaic cell measured using the apparatus of FIG. 5.
Figure 7:
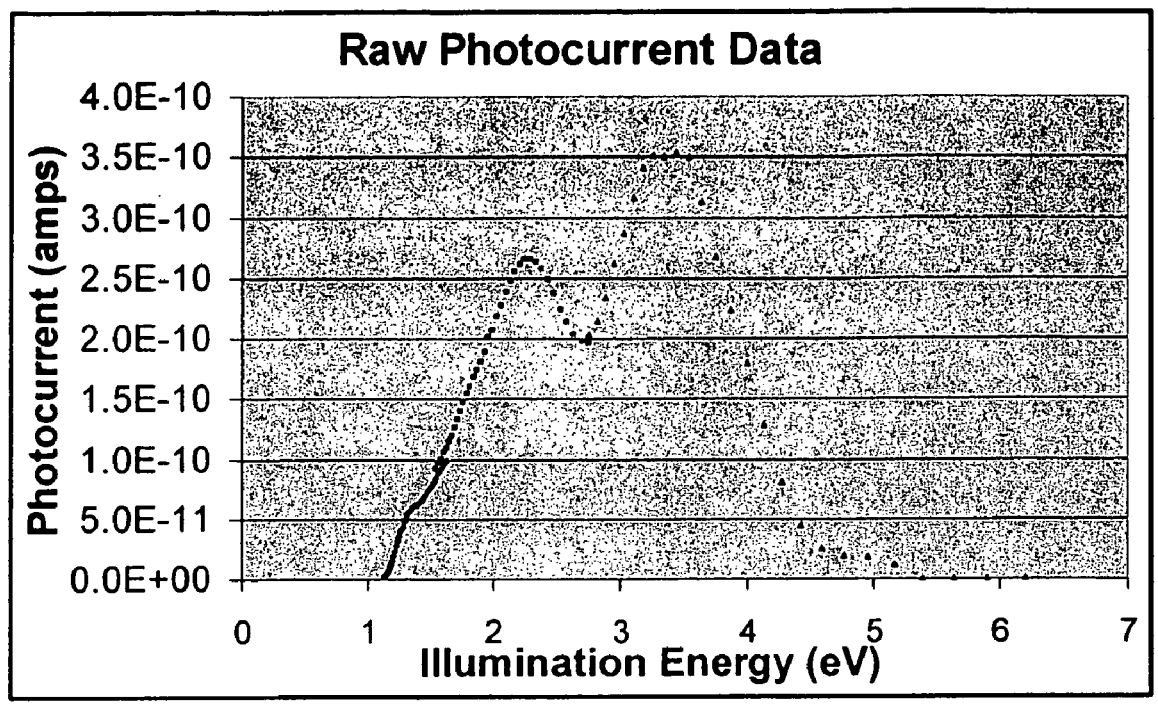
FIG. 7 is a graph of the raw photocurrent of a second photovoltaic cell measured using the apparatus of FIG. 5.

Photocurrent testing of the resulting devices was carried out using a white-light port at the Synchrotron Radiation Center in Stoughton, Wis. FIG. 5 shows a schematic diagram of the experimental set-up 500 used to obtain the photocurrent measurements. Radiation was generated using the synchrotron 501. In these tests a monochromator 502 was used to select a desired wavelength and the radiation was passed through a filter 504 and a chopper 506 before a lens 508 directed the radiation onto the photovoltaic devices 510. Raw photocurrent data were obtained through a lock-in amplifier's 512 measurement of the current divided by a number (typically about 1 to 2) proportional to the synchrotron's beam flux. The illumination intensity was typically in the microwatt range, but would vary with wavelength. The raw photocurrent for two different titanium-nanotube-gold devices is shown in FIGS. 6 and 7.

It is understood that the invention is not confined to the particular embodiments set forth herein as illustrative, but embraces all such forms thereof as come within the scope of the following claims.

What is claimed is:

1. A photovoltaic cell comprising:
   (a) an insulating support having opposed front and rear surfaces;
   (b) a first contact extending along the front surface and supported thereby, the first contact comprising a first electrically conductive contact material;
   (c) a second contact extending along the front surface and supported thereby, the second contact comprising a second electrically conductive contact material wherein the first and second contacts are spaced apart along the front surface to be bridgeable by a single nanotube;
   (d) a plurality of photoconductive carbon nanotubes lying along the front surface aligned in a plane of the front surface, each nanotube bridging between the first contact comprising a first electrically conductive contact material and the second contact comprising a second electrically conductive contact material, the carbon nanotubes configured to receive light directed at the front surface along a path substantially normal to the front surface;
   wherein the carbon nanotubes directly contact the contacts;
   wherein the work function of the first electrically conductive contact material differs from the work function of the carbon nanotubes,
   further wherein the junctions between the first electrically conductive material and the carbon nanotubes form Schottky barriers for electrons or holes; and
   whereby light illuminating the photovoltaic cell produces an electrical voltage across the first and second contacts.

2. The photovoltaic cell of claim 1 wherein the work function of the first electrically conductive contact material is lower than the work function of the carbon nanotubes and further wherein the junctions between the first electrically conductive contact material and the carbon nanotubes form Schottky barriers for electrons and the junctions between the second electrically conductive contact material and the carbon nanotubes do not form Schottky barriers for electrons.

3. The photovoltaic cell of claim 2 wherein the junctions between the second electrically conductive contact material and the carbon nanotubes form Schottky barriers for holes.

4. The photovoltaic cell of claim 2 wherein the junctions between the second electrically conductive contact material and the carbon nanotubes do not form Schottky barriers.

5. The photovoltaic cell of claim 2 wherein the first and second electrically conductive contact materials are independently selected from the group consisting of metals, conducting polymers and conducting oxides.

6. The photovoltaic cell of claim 2 wherein the first electrically conductive contact material comprises a first metal and the second electrically conductive contact material comprises a second metal.

7. The photovoltaic cell of claim 6 wherein the work function of the first metal is lower than the work function of the carbon nanotubes by at least 0.3 eV and the work function of the second metal and the work function of the carbon nanotubes differ by no more than 0.1 eV.

8. The photovoltaic cell of claim 6 wherein the first metal is titanium and the second metal is gold.

9. The photovoltaic cell of claim 2 wherein the nanotubes are disposed on a polymer film.

10. The photovoltaic cell of claim 9 wherein the polymer film comprises a polymer selected from the group consisting of polyamides, polyethylene and polyesters.

11. The photovoltaic cell of claim 2 wherein the plurality of nanotubes comprises carbon nanotubes that have different bandgaps.

12. The photovoltaic cell of claim 2 wherein the surface density of carbon nanotubes on the first and second contacts is at least about $10^9$ nanotubes/cm$^2$.

13. The photovoltaic cell of claim 2 wherein the surface density of carbon nanotubes on the first and second contacts is at least about $10^{10}$ nanotubes/cm$^2$.

14. The photovoltaic cell of claim 2 wherein the photovoltaic cell has a current density of at least about 50 mA/cm$^2$.

15. The photovoltaic cell of claim 2 wherein the photovoltaic cell has a current density of at least about 100 mA/cm$^2$.

16. The apparatus of claim 1 wherein single carbon nanotubes have an aerial density of greater than $10^9$ nanotubes per square centimeter.

* * * * *